United States Patent
Ermisch et al.

(10) Patent No.: US 10,333,386 B2
(45) Date of Patent: Jun. 25, 2019

(54) METHOD FOR DETECTING A VOLTAGE COLLAPSE

(71) Applicant: SIEMENS AKTIENGESELLSCHAFT, Munich (DE)

(72) Inventors: Ronny Ermisch, Fuerth (DE); Nizar Lassoued, Erlangen (DE); Dominik Schuster, Diespeck (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/306,138

(22) PCT Filed: Apr. 25, 2014

(86) PCT No.: PCT/EP2014/058494
§ 371 (c)(1),
(2) Date: Oct. 24, 2016

(87) PCT Pub. No.: WO2015/161893
PCT Pub. Date: Oct. 29, 2015

(65) Prior Publication Data
US 2017/0047837 A1    Feb. 16, 2017

(51) Int. Cl.
| | |
|---|---|
| *H02M 1/32* | (2007.01) |
| *H02M 7/217* | (2006.01) |
| *G01R 19/165* | (2006.01) |
| *H02H 7/125* | (2006.01) |
| *H02M 7/483* | (2007.01) |

(52) U.S. Cl.
CPC ............ *H02M 1/32* (2013.01); *G01R 19/165* (2013.01); *H02H 7/1255* (2013.01); *H02H 7/1257* (2013.01); *H02M 7/217* (2013.01); *H02M 2001/325* (2013.01); *H02M 2007/4835* (2013.01)

(58) Field of Classification Search
CPC .... G01R 31/028; G01R 31/42; G01R 31/016; G01R 27/2605; G01R 31/025
USPC ......................................................... 324/548
See application file for complete search history.

(56) References Cited

U.S. PATENT DOCUMENTS

| | | | | |
|---|---|---|---|---|
| 3,508,134 A | * | 4/1970 | Dosch ................... | H02P 7/295 323/327 |
| 7,855,906 B2 | * | 12/2010 | Klodowski ............ | H02M 7/48 363/97 |

(Continued)

OTHER PUBLICATIONS

Kelly, Patrick J. "A Practical Guide to 'Free-Energy' Devices." (2010). P. J. Kelly, "A Practical Guide to Free-Energy Devices—Chapter 6: Pulse-Charging Battery Systems," as cited in Fakhrurrazey.*

(Continued)

*Primary Examiner* — Christopher P McAndrew
(74) *Attorney, Agent, or Firm* — Laurence Greenberg; Werner Stemer; Ralph Locher

(57) ABSTRACT

A method detects a working voltage collapse by use of an electric component, in which the exceeding of a critical characteristic of the working voltage is monitored and an excess is detected as a collapse. Accordingly, in order to recognize the collapse breakdown in a simple trouble-free manner, a model voltage generated by a model circuit is used as the critical characteristic.

12 Claims, 2 Drawing Sheets

(56) References Cited

U.S. PATENT DOCUMENTS

| | | | | |
|---|---|---|---|---|
| 8,050,062 B2* | 11/2011 | Wagoner | | H02J 3/383 323/266 |
| 8,085,564 B2* | 12/2011 | Klodowski | | H02M 7/48 363/97 |
| 8,138,632 B2* | 3/2012 | Sommer | | H02M 7/49 307/87 |
| 8,184,461 B2* | 5/2012 | Mabuchi | | H02J 3/383 363/124 |
| 8,390,968 B2* | 3/2013 | Dorn | | H01H 79/00 361/111 |
| 8,422,257 B2* | 4/2013 | Asplund | | H02J 3/36 363/35 |
| 8,638,576 B2* | 1/2014 | Hosini | | H02J 3/1842 363/50 |
| 8,649,187 B2* | 2/2014 | Aiello | | H02M 7/483 363/131 |
| 9,875,874 B2* | 1/2018 | Labitzke | | H01J 37/24 |
| 2006/0082376 A1* | 4/2006 | Allen | | G01R 31/2884 324/522 |
| 2008/0192514 A1* | 8/2008 | Zhou | | H02M 3/335 363/21.12 |
| 2008/0232145 A1* | 9/2008 | Hiller | | H02H 7/1225 363/56.01 |
| 2014/0070618 A1* | 3/2014 | Bajaj | | H02J 7/0052 307/66 |

OTHER PUBLICATIONS

Fakhrurrazey, Fahzal Shahrel, Wan Noraishah Wan Abdul Munim, and Zulkifli Othman. "Performance comparison of 4-Pole Neodymium Magnet Bedini SSG free energy generator." Power Engineering and Optimization Conference (PEOCO), 2014 IEEE 8th International. IEEE, 2014.*

Patrick J. Kelly; "Chapter 6: Pulse-Charging Battery Systems"; pp. 1-52; XP055158756.

* cited by examiner

METHOD FOR DETECTING A VOLTAGE COLLAPSE

BACKGROUND OF THE INVENTION

Field of the Invention

The invention relates to a method for detecting a collapse of a working voltage across an electrical component, in which the working voltage is monitored for the crossing of a critical characteristic and a crossing is detected as a collapse.

Due to the rise in supply of renewable energies to power grids, high-voltage direct-current (HVDC) electrical power transmission is becoming increasingly important. A low-radiation and low-cost cable connection, implementable using HVDC transmission technology, is preferred particularly in the case of offshore wind farms. As there is no stable grid present in offshore wind farms, self-commutated HVDC transmission, in particular, affords the advantage of making regulated reactive power available offshore. Additionally, self-commutated HVDC transmission can be used to improve the dynamic response at the connecting node.

Core elements of the connections from the wind farm grid to the HVDC transmission system and from the HVDC transmission system to large mainland lines are formed from self-commutated HVDC transmission converters with a voltage link and transistors, in particular IGBTs (insulated gate bipolar transistors). The possibility of being able to regulate active and reactive power independently of one another facilitates the connection of self-commutated converters to three-phase power grids with low short-circuit power. The operation of separate grids is also possible, as the establishment of the grid, referred to as a black start, is simplified. Self-commutated HVDC transmission converters are equipped with large DC capacitors that are used to support the converted voltage. Transformation from three-phase current to DC current or vice versa is achieved via switching—normally two—series-connected IGBTs, between which the AC current branches off.

In the event of a switching fault in a self-commutated HVDC converter, a sudden discharge of the energy contained in the DC capacitor through the switches may occur. The energy thus released leads to the switches, and hence the converter, being destroyed.

BRIEF SUMMARY OF THE INVENTION

An object of the present invention is to provide a method for detecting a collapse of a working voltage in order to be able to limit the damage to a converter in the event of a switching fault.

This object is achieved by a method of the type stated in the introduction, in which a model voltage generated by a model circuit is used as critical characteristic.

The invention is based on the consideration that it is advantageous to safely bypass or switch off a converter in the event of a fault. This can be achieved using a bypass that, for example, is ignited and thereby closed. An ignition criterion may be the shorting or collapse of the working voltage across the capacitor of the converter. It is possible to monitor for the collapse of the working voltage across the capacitor by monitoring the decrease in, i.e. the negative slope of, the working voltage over time, i.e. the voltage slope or du/dt. If the decrease exceeds a threshold value, then this may be detected as indicating a collapse of the working voltage. Monitoring of this type is error prone however, especially in the case of large and very brief voltage fluctuations which were not caused by a voltage collapse.

The invention makes it possible to overcome this problem. The voltage slope per se is not monitored, rather the fact of whether the profile of the working voltage crosses the model voltage. A brief negative slope spike may occur without the bypass being triggered. Only when the working voltage has dropped to such an extent that it crosses the model voltage, which is also decreasing, is it assumed that a voltage collapse has occurred. In the rest of this document, the term crossing is understood to mean a crossing in any direction as well as just an attainment, and in which it is understood to mean in particular that the temporal profile of the working voltage reaches the model voltage from above and, in particular, crosses it from above to below, i.e. drops therebelow.

An additional advantage of using the model voltage as a critical characteristic is that a great deal of freedom with regard to adjustable variables is gained, thereby allowing the detection of the working voltage collapse to be easily adapted to multiple different working situations.

It is possible to monitor for the crossing by comparing the working voltage with the model voltage over time. This may be done at points, periodically or continuously, according to the monitoring circuit. A drop in the working voltage across the electrical component that is faster than that which is possible and/or permissible in regular operation may be understood to be a collapse. The drop in voltage does not necessarily have to be to zero. The voltage collapse may occur due to a switching fault in a switch, which, for example, triggers a short circuit. The collapse of the working voltage across the electrical component may lead to an overcurrent situation in the electrical unit, i.e. to a current flow that is higher than that which is possible and/or permissible in regular operation.

The monitored working voltage may directly be the voltage across the component or be a measurement voltage that is derived from the voltage across the component, e.g. using a voltage divider. It is expediently proportional to the voltage across the component. For the sake of simplicity, the measurement voltage derived from the voltage across the component is also referred to as a working voltage. The use of a measurement voltage or the indirect measurement of the working voltage is advantageous particularly 'in the case of a high voltage, in the kilovolt range, across the component, since in this way a direct comparison with the model voltage, which is particularly easy to generate in the range of only a few volts, is possible.

The detection of the collapse may be understood to be a consequent action the initiation of which is causally dependent on the crossing. It may be a signal to a comparator or to a sensor. Expediently, on detection of the crossing, an action is initiated to divert the current flow generated by the voltage drop.

In the case that the electrical component is a capacitor, the invention may also be referred to as a method for detecting a discharging of a capacitor, in which the working voltage across the capacitor is monitored for the crossing of the critical characteristic.

In one advantageous embodiment of the invention, the model circuit generates the model voltage from the working voltage. The model circuit may be supplied from the working voltage and thus require no external voltage supply. As a result, the model circuit, or rather its power supply, may be kept very simple.

Expediently, the working voltage directly raises the model voltage, so that an increase in the working voltage may also lead to an increase in the model voltage. In so doing, the model voltage may be directly raised by the working voltage. Expediently, the model voltage is coupled to the working voltage in such a way that an increase or drop in the working voltage leads to an increase or drop in the model voltage, where the model voltage expediently lies below the working voltage by a noise margin, which prevents a collapse being erroneously detected. The noise margin between the two voltages is expediently dependent on the magnitude of the working voltage.

The noise margin makes it possible to avoid an erroneous triggering in the event of a permissible fluctuation in the working voltage with a temporarily high voltage slope.

Expediently, an incipient drop in the working voltage triggers an incipient drop in the model voltage. In this case, it is advantageous if the model voltage is dependent on the working voltage in such a way that when the working voltage drops, it also drops, although never more steeply than with a model rate. The model rate is expediently independent of the rate of the drop in the working voltage. The rate may be visualized as a voltage slope over time.

In one configuration of the invention that is particularly advantageous due to its simplicity, the model circuit is a hardware circuit that generates the model voltage, in particular from the working voltage, using only hardware elements. The model circuit may be devoid of electronics, i.e. devoid of electronic control processes, and is, for example, formed from only a few electrical components, such as capacitors, ohmic resistors, diodes and/or transistors, where the number thereof expediently does not exceed twenty.

If the electrical component is a capacitor, then on detection of the collapse a bypass is expediently closed, through which the capacitor is discharged. The working voltage, which is proportional to the voltage across the capacitor, may be drawn off without causing further damage.

Advantageously, the model voltage is raised along with an increase in the working voltage but is decoupled from a drop in the working voltage by the model circuit. Consequently, the model voltage may set the critical threshold, at the point of which the profile of the working voltage must be rated as a collapse, as a characteristic independently of a rate of decrease in the working voltage.

For decoupling, one or more diodes may be used, making it possible to raise the model voltage proportionally with the working voltage while separating the drop in the model voltage from the drop in the working voltage. A noise margin may also easily be set up using the diode, i.e. a voltage difference by which the model voltage is spaced apart from the working voltage, in particular lying further there below.

Advantageously, the drop in the model voltage occurs independently of the profile of the drop in the working voltage with a drop rate preset by the model circuit, in particular using hardware. In this way collapse detection that is especially unsusceptible to error, and yet, through the choice of hardware components, is adjustable, may be effected. The drop rate should be understood to be an absolute quantity, i.e. volts per second.

It is additionally advantageous if the drop rate of the model voltage, decoupled from the working voltage, is dependent on the initial voltage of the working voltage.

Expediently, the drop rate gets higher as the initial voltage increases.

The drop rate of the model voltage is expediently set by an ohmic resistor, in particular in combination with a capacitor. The resistor may be of a fixed size that—potentially depending on the initial voltage—determines the drop rate.

A high degree of variability may be achieved if the resistor may be adjusted, for example using a control unit, in particular using control electronics, which also monitors the switching of the bypass. Adjustability of the size of the resistor may easily be achieved using multiple connectable individual resistors, which together form the ohmic resistor. Connection or disconnection can be effected by the control unit, for example depending on various operating modes of the converter. The operating modes may be set depending on the initial voltage of the working voltage or on the maximum working voltage reached in regular operation.

The reliability of detection of the voltage collapse can be further increased if, on crossing the characteristic, the working voltage is forced substantially above the characteristic by a measuring element. The working voltage, which is expediently proportionally derived from the voltage across the electrical component, may in this way be reliably and lastingly pulled in particular below the model voltage so that multiple voltage crossings may be avoided and uncertainty in collapse detection is thereby also avoided.

The invention furthermore pertains to a converter module with an electrical component and a monitoring unit for monitoring a profile of the working voltage across the electrical component for the crossing of a critical characteristic.

It is proposed that the monitoring unit according to the invention have a model circuit for generating a model voltage and a comparator for comparing the working voltage with the model voltage and for issuing a signal if the working voltage crosses the model voltage as a critical characteristic.

Advantageously, the model circuit is embodied so that the model voltage is present at an output that is corrected to the working voltage, in particular via a noise margin generator, i.e. a voltage spacer, so that the working voltage raises the model voltage. The correction is also expediently such that a drop in both voltages is decoupled.

Advantageously, the electrical component is a capacitor positioned between two DC supply lines of a switch. According to the feed actuating direction, the DC supply lines may also be DC outgoing lines of the switch.

The invention is particularly advantageously applicable to a converter arrangement embodied as a self-commutated HVDC transmission converter with transistors and a voltage link, in which one capacitor is expediently arranged as a valve.

The invention is also advantageously applicable to a converter arrangement with a number of converter modules as described above which are connected in 2×3 series and the external connections of three series circuits each form a DC voltage side.

The above description of advantageous configurations of the invention contains numerous features that are reproduced in a manner combined as a plurality in part in the individual dependent claims. However, these features may expediently also be considered individually and combined to form expedient further combinations. In particular, these features may be combined in each case individually and in any suitable combination both with the method according to the invention and with the converter module according to the invention as claimed in the independent claims. Thus, method features should be considered also to be worded substantively as properties of the corresponding apparatus unit and vice versa.

The above-described properties, features and advantages of this invention and the manner in which they are achieved will become clearer and more easily understandable in conjunction with the following description of exemplary embodiments, which are explained in more detail in conjunction with the drawings. The exemplary embodiments serve to explain the invention and do not limit the invention to the combination of features specified therein, not even in relation to functional features. Moreover, features of each exemplary embodiment, which are suitable therefor, may also be considered explicitly in an isolated manner and be combined with any one of the claims.

DESCRIPTION OF THE INVENTION

Figure 1:
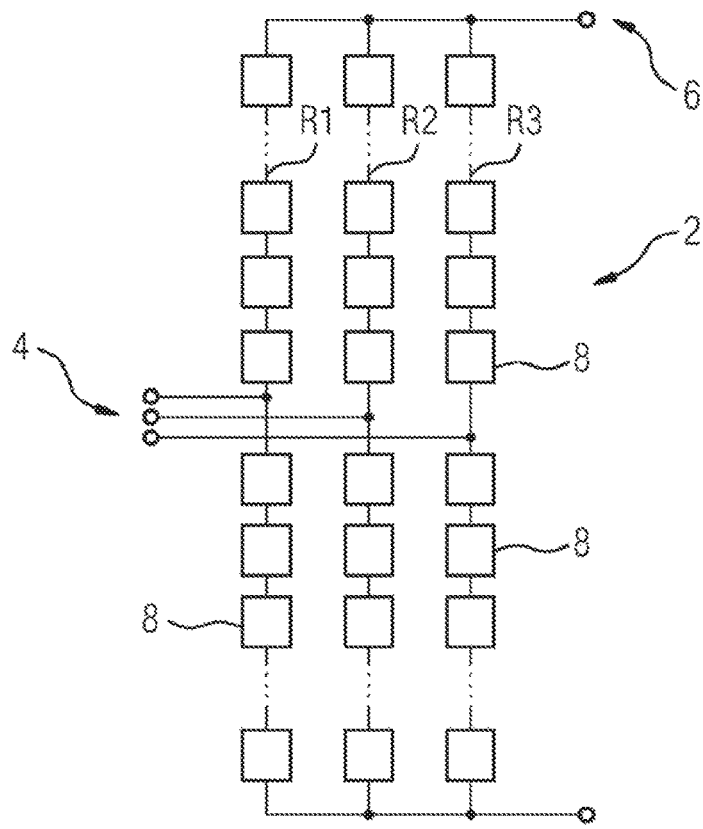
FIG. 1 a self-commutated HVDC transmission converter with a plurality of HVDC power modules connected in series.

FIG. 1 shows a converter arrangement 2 in the form of a self-commutated HVDC transmission converter for converting three-phase current at a three-phase current input 4 to a direct current at a DC output 6, or vice versa. The converter 2 has a plurality of converter modules 8 that are connected in series so that each of the three three-phase current phases of the three-phase current input 4 is connected to the two DC phases of the DC output 6 via a respective chain. Due to the arrangement of the converter modules 8 in two times three series circuits R1, R2, R3 connected in parallel, in which the external connections form the DC voltage side of the converter arrangement 2, high voltage may be paired with high current levels.

Located between two series circuits R1, R2, R3, which are connected oppositely in terms of voltage, is a respective intermediate connection which forms one of the three AC voltage connections of the three-phase current input 4 and thus, in terms of potential, is located between the upper converter modules 8 and the lower converter modules 8 of the two series circuits R1, R2, R3 in FIG. 1.

Figure 2:
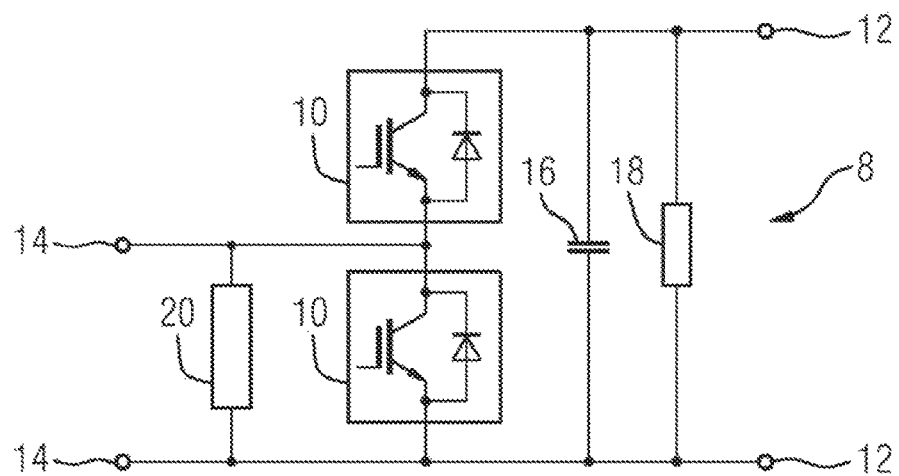
FIG. 2 an HVDC power module with two switches, one capacitor, one monitoring unit and one bypass.

The converter modules 8 of the converter arrangement 2 are embodied identically and are presented in more detail in FIG. 2. Each converter module 8 comprises two switches 10, each of which is embodied as an IGBT and designed to switch currents in the kA range and voltages in the kV range. The two switches 10 are located, in terms of potential, in series between the two poles of the DC voltage output 12, where one pole of the AC input 14 is coupled to one pole of the DC output 12 and the other AC input 14 is located between the two switches 10 in terms of potential.

Connected between the two poles of the DC voltage output 12—where input and output should be understood as corresponding to the direction of current for conversion—are a capacitor 16 and a monitoring unit 18. Connected between the two poles of the AC voltage output 14 is a bypass 20. The bypass 20 contains a pyrotechnic charge for propelling a plunger in order to short the two poles of the AC voltage output 14 in the event of a fault in the converter module 8. The bypass 20 is actuated by the monitoring unit 18 that detects a fault situation such as, for example, the simultaneous activation of both switches 10, so that the capacitor 16 discharges via the two switches 10 in an internal short circuit. The monitoring unit then actuates the bypass 20 so that the converter module 8 is bypassed and removed from the series circuits R1, R2, R3. Control electronics detect the fault or the failure of the converter module 8 and actuate the remaining converter modules 8 of the series circuits R1, R2, R3 correspondingly, so that the current conversion operation is continued as normal. Alternatively, it is conceivable for the bypass 20 to be switched between the two poles of the DC voltage output 12, so that the capacitor 16 preferably discharges via the bypass 20.

The circuit in FIG. 2 is only one example out of a multiplicity of possible ways in which a working voltage across an electrical component, such as across the capacitor 16 of FIG. 2, for example, may collapse and be detected by a monitoring unit, such as the monitoring unit 18 of FIG. 2, for example, so that protective measures may be initiated. In this respect, the invention is not limited to an arrangement such as in FIG. 2.

Figure 3:
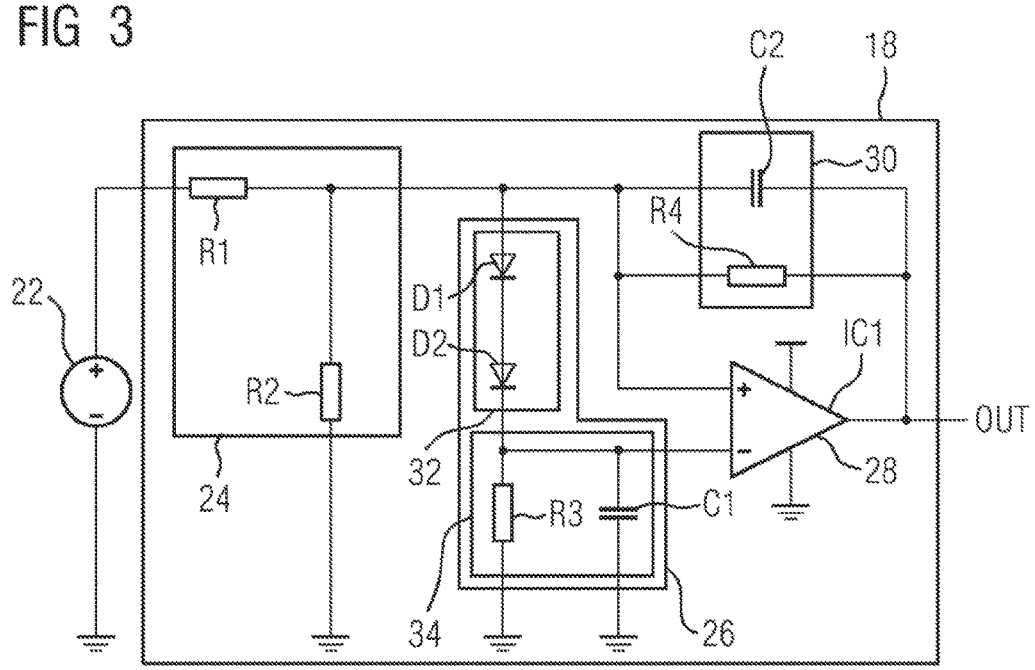
FIG. 3 a circuit layout of the monitoring unit of FIG. 2.

FIG. 3 shows an exemplary circuit of the monitoring unit 18. By way of example, an electrical component 22, across which a working voltage is present, is shown. The electrical component 22 may be the capacitor 16 or another component. Also by way of example in FIG. 3, one pole of the working voltage across the component 22 is grounded. This is not obligatory and is in fact otherwise in the embodiment of FIG. 2.

The monitoring unit 18 contains a voltage divider 24, a model circuit 26, a comparator 28 and additional circuitry 30 for the comparator 28, said additional circuitry containing a booster C2 and a stabilizer R4, for the comparator 28. The voltage divider 24 serves to decrease the working voltage so that it lies at a level facilitating comparison. This decreased working voltage—although lower than the working voltage across the electrical component 22—is likewise also referred to as a working voltage, and it is expediently always proportional to the working voltage across the electrical component 22, potentially shifted by a noise margin. The voltage divider 24 contains two ohmic resistors R1, R2 by means of which the voltage division, i.e. the level of the decreased working voltage, may be adjusted. Thus, the working voltage is decreased from e.g. 3600 V across the electrical component 22 to e.g. below 20 V in the monitoring unit 18.

The model circuit 26 serves to generate a model voltage. In the exemplary embodiment shown, the model voltage is directly generated from the decreased working voltage by virtue of this working voltage being present across the model circuit 26. The model voltage always lies below the working voltage, where one pole of the model voltage may be connected to one pole of the working voltage, as has been effected, by way of example, via the grounding in the exemplary embodiment of FIG. 3.

The model voltage is different from the working voltage in two ways. First, it is set below the working voltage by an interference voltage or noise margin. Second, it is decoupled from a strongly decreasing working voltage. Spacing and decoupling may be carried out by two different components, a spacer and a decoupler. It is also possible, however, for both functions to be carried out by a single component, as shown by way of example in FIG. 3 by the decoupler 32, which is formed from two diodes D1, D2. Another possibility is to form the decoupler 32 from one or more transistors. This allows decoupling to be improved, although spacing is essentially lost, thus making a separate spacer expedient in this case. A compromise between the two variants may be achieved if the decoupler 32 contains only one diode and one transistor, where the diode sets the voltage spacing and the transistor essentially provides for the decoupling.

In order to generate the model voltage, the model circuit 26 additionally contains a slope former 34 which determines the voltage drop in the model voltage over time. The voltage model is generated, in the case of the model circuit 26 of FIG. 3, by means of an ohmic resistor R3 and a capacitor C1. In the event of a very rapid drop in the working voltage and the slope former 34 being decoupled from the working voltage by the decoupler 32, the capacitor C1 serves as an energy source, the energy of which is dissipated over time by the ohmic resistor R3, whereby the model voltage drops.

In this instance, the drop rate or negative voltage slope is defined according to its maximum profile; the fastest possible drop in the model voltage is thus determined by the slope former 34. A slower profile of the voltage drop is always possible and is codetermined by the decoupler 32. If the working voltage drops very rapidly, however, the drop in the model voltage is limited by the slope former 34. This limitation does not constitute an absolute value of the voltage drop or slope, since this depends on the initial variable of the model voltage or working voltage—the higher the initial value of the model voltage, the larger, too, the maximum negative slope.

While the decoupler 32 thus decouples the model voltage from a very rapid drop in the working voltage, the decoupler 32 links the model voltage to an increasing or constant working voltage. Thus, if the working voltage increases, then the model voltage also increases. If the working voltage drops only slowly, then the model voltage also drops more slowly than in the case of the maximum possible drop. If the working voltage remains at a value, then the model voltage—after a short adjustment—also remains constant.

The comparator 28 is, in this exemplary embodiment, an operational amplifier at the two inputs of which the model voltage and working voltage, respectively, are present. In this exemplary embodiment, the working voltage is present at the positive input and the model voltage is present at the negative input of the operational amplifier or comparator 28. The additional circuitry 30 of the comparator 28 contains a stabilizer in the form of an ohmic resistor R4 and a booster in the form of a capacitor C2.

Figure 4:
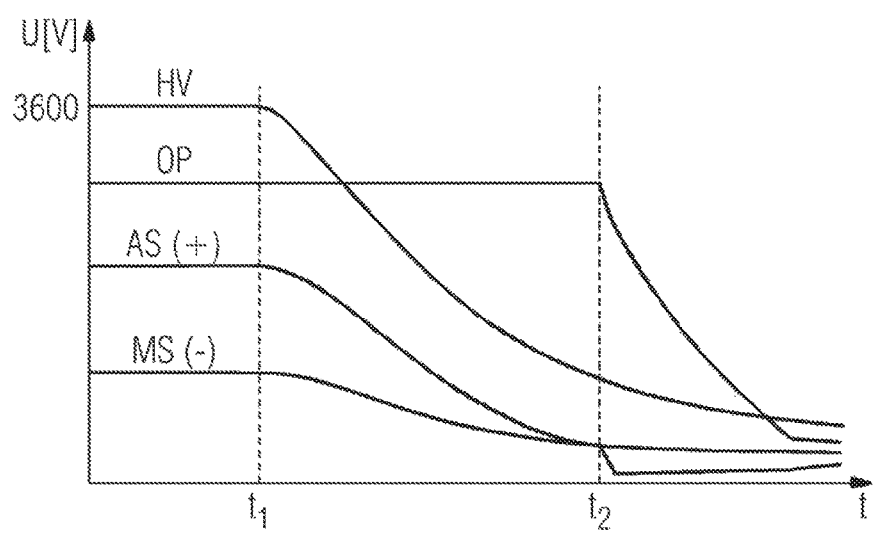
FIG. 4 the profile of the high-voltage working voltage across the capacitor of FIG. 2 and the profile of a model voltage of the monitoring unit of FIG. 2 over time.

A process of detecting a collapse of the working voltage is explained, by way of example, using the diagram of FIG. 4. The diagram shows the voltage U in volts over time.

In the exemplary embodiment shown, the working voltage HV across the electrical component 22 is 3600 V and is denoted by HV (high voltage) in FIG. 4. The decreased working voltage AS is decreased to 12 V, for example, by the voltage divider 24. Since it is inconsequential, for the purposes of the invention, whether the working voltage HV across the electrical component 22 is directly or indirectly monitored via the decreased working voltage AS, the decreased working voltage AS is also referred to as a working voltage HV across the electrical component 22.

The voltage profiles shown in FIG. 4 are not represented proportionally to one another, but rather arranged by magnitude so that the relationships between the profiles are made clear. Thus the decreased voltage AS—depending on the magnitude of the high voltage HV—may lie 15 V above or below the output OP of the comparator 28. The noise margin between the model voltage MS and the decreased working voltage AS may also essentially be freely set and thereby be matched to the specific application.

The temporal profile of the decreased working voltage AS is coupled to the temporal profile of the high voltage HV across the electrical component 22 in a predetermined manner. At constant high voltage HV the working voltage AS is also constant. This is shown in FIG. 4 up until time $t_1$. At this time $t_1$ the high voltage HV across the electrical component 22, i.e. the high voltage HV of 3600 V, collapses. The diagram in FIG. 4 shows a time span of only a few milliseconds, so the high voltage HV does not drop vertically downward, but rather a continuous and steady drop in the high voltage HV is detectable.

The drop in the model voltage MS is set by the slope former 34 so that the working voltage AS does not reach the model voltage MS in regular operation of the converter arrangement 2. Crossing of the working voltage AS over the model voltage MS is thus not possible in regular operation, but rather only in the event of a collapse of the working voltage AS due to a faulty operating state.

The collapse of the high voltage HV across the electrical component 22 begins at time $t_1$. Accordingly, the drop in the working voltage AS also begins at the same time $t_1$. The collapse of the working voltage AS is decoupled from the drop in the model voltage MS by the decoupler 32, so that the model voltage MS drops according to the slope formed by the slope former 34. This drop is independent of the slope of the working voltage AS.

At the start of the collapse of the working voltage AS, the model voltage MS and the working voltage AS are spaced apart from one another by a noise margin—e.g. 3 V in the exemplary embodiment of FIG. 4. The noise margin prevents the two voltages AS, MS from unintentionally meeting or crossing one another due to undesirable, voltage-influencing effects.

The drop in the high voltage HV across the electrical component 22 occurs, in this instance, more rapidly than is possible or permissible in regular operation. Since the negative slope of the working voltage AS is larger than the negative slope of the model voltage MS, the working voltage AS approaches the model voltage MS over time. At time $t_2$, the working voltage AS reaches the model voltage MS, as shown in FIG. 4. Since the working voltage AS is present at the positive input + of the comparator 28 and the model voltage MS is present at the negative input −, in the event of loss of the noise margin the comparator 28 reacts with a corresponding signal, which may also denote detection of the collapse of the working voltage AS.

The signal OP of the comparator 28 is, in this exemplary embodiment, a rapid drop in the voltage at the output of the comparator 28 in the event of disappearance of the noise margin at time $t_2$. Due to this signal the bypass 20 is now actuated and the short circuit of the bypass 20 between both poles of the DC voltage output 12 is closed. The working voltage AS is thus monitored for the crossing of the model voltage MS as a critical characteristic and the crossing at time $t_2$ is detected as a collapse of the working voltage AS.

Additionally, the output of the comparator 28 is connected to the working voltage AS via the additional circuitry 30. The large drop in the comparator voltage OP also pulls the working voltage AS down, as may be seen in FIG. 4. This therefore substantially crosses the model voltage MS, so that a jump in the comparator voltage OP is avoided.

In operation of the converter 8 it may occur that the converter—due to various operating modes of the converter arrangement 2—is affected by various maximum working voltages AS. In this case it may be advantageous if the drop rate may be set depending on the respective operating mode, the drop rate thus being dependent not only on the maximum working voltage AS, but also on the current operating mode. Since the drop rate of the model voltage MS is adjustable using the resistor R3—the larger the resistor R3, the lower the drop rate—it is advantageous if instead of a fixed resistor, an adjustable resistor R3 is provided. By way of example, the resistor R3 contains a plurality of individually connectable resistor units, which may be connected or disconnected by a control unit, e.g. control electronics, depending on the current operating mode.

LIST OF REFERENCES

2 Converter arrangement
4 Three-phase current input
6 DC current output
8 Converter module
10 Switch
12 DC voltage output
14 AC current input
16 Capacitor
18 Monitoring unit
20 Bypass
22 Electrical component
24 Voltage divider
26 Model circuit
28 Comparator
30 Additional circuitry
32 Decoupler
34 Slope former
AS Working voltage
C1-C2 Capacitor
D1-D2 Diode
HV High voltage
MS Model voltage
OP Output signal
R1-R4 Resistor

The invention claimed is:

1. A method for detecting a collapse of a working voltage across an electrical component and for initiating a protective measure, which comprises the steps of:
   providing a capacitor as the electrical component;
   with a comparator, comparing the working voltage with a critical characteristic and upon detecting that the working voltage drops below the critical characteristic, outputting a signal from the comparator indicating that the collapse has been detected;
   activating a bypass to short-circuit a voltage output in response to the signal output from the comparator, wherein the bypass discharges the capacitor; and
   using a model voltage generated by a model circuit as the critical characteristic, wherein an incipient drop in the working voltage triggers the model voltage to start to drop.

2. The method according to claim 1, wherein the model circuit generates the model voltage from the working voltage.

3. The method according to claim 1, wherein the model circuit is a hardware circuit that generates the model voltage from the working voltage using only hardware elements.

4. The method according to claim 1, wherein as the working voltage increases the model voltage also increases and the model voltage is decoupled from a drop in the working voltage by the model circuit.

5. The method according to claim 1, wherein a drop in the model voltage takes place independently of a profile of a drop in the working voltage with a drop rate preset by the model circuit using hardware.

6. The method according to claim 5, wherein the drop rate of the model voltage that is decoupled from the working voltage is dependent on an initial voltage of the working voltage.

7. The method according to claim 1, wherein on crossing the critical characteristic, the working voltage is forced substantially above the critical characteristic by a measuring element.

8. The method according to claim 1, which further comprises decoupling the model voltage from a drop in the working voltage via at least one diode.

9. The method according to claim 1, wherein in an initial state, the model voltage is spaced apart from the working voltage by a noise margin.

10. A converter module, comprising:
    a capacitor;
    a monitoring unit for monitoring a profile of a working voltage across said capacitor for a crossing of a critical characteristic, said monitoring unit having a model circuit for generating a model voltage and a comparator for comparing the working voltage with the model voltage and for issuing a signal if the working voltage drops below the model voltage as the critical characteristic, wherein an incipient drop in the working voltage triggers the model voltage to start to drop; and
    a bypass being activatable to short-circuit a voltage output in response to the signal output from the comparator, wherein the bypass discharges the capacitor.

11. The converter module according to claim 10, further comprising a switch having two DC supply lines, said capacitor is positioned between said two DC supply lines of said switch.

12. A converter configuration, comprising:
    a number of converter modules each having a capacitor and a monitoring unit for monitoring a profile of a working voltage across said capacitor for a crossing of a critical characteristic, said monitoring unit having a model circuit for generating a model voltage and a comparator for comparing the working voltage with the model voltage and for issuing a signal if the working voltage drops below the model voltage as the critical characteristic, said converter modules are connected in 2×3 series and an external connections of three of said series circuits each form a DC voltage side, wherein an incipient drop in the working voltage triggers the model voltage to start to drop.

* * * * *

UNITED STATES PATENT AND TRADEMARK OFFICE
CERTIFICATE OF CORRECTION

PATENT NO.        : 10,333,386 B2
APPLICATION NO.   : 15/306138
DATED             : June 25, 2019
INVENTOR(S)       : Ronny Ermisch et al.

It is certified that error appears in the above-identified patent and that said Letters Patent is hereby corrected as shown below:

In the Claims

Column 10, Line 41, Claim 12 should read:
A converter configuration, comprising:
    a number of converter modules each having a capacitor and a monitoring unit for monitoring a profile of a working voltage across said capacitor for a crossing of a critical characteristic, said monitoring unit having a model circuit for generating a model voltage and a comparator for comparing the working voltage with the model voltage and for issuing a signal if the working voltage drops below the model voltage as the critical characteristic, said converter modules are connected in $2 \times 3$ series and an external connections of three of said series circuits each form a DC voltage side, wherein an incipient drop in the working voltage triggers the model voltage to start to drop;
    wherein each one of the number of converter modules includes a bypass being activatable to short-circuit a voltage output in response to the signal output from the comparator, and wherein the bypass discharges the capacitor.

Signed and Sealed this
Sixth Day of August, 2019

Andrei Iancu
*Director of the United States Patent and Trademark Office*